(12) United States Patent
Okada et al.

(10) Patent No.: US 10,698,283 B2
(45) Date of Patent: Jun. 30, 2020

(54) LIQUID CRYSTAL DISPLAY DEVICE

(71) Applicant: SHARP KABUSHIKI KAISHA, Sakai, Osaka (JP)

(72) Inventors: Kuniaki Okada, Sakai (JP); Seiichi Uchida, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 13 days.

(21) Appl. No.: 16/147,407

(22) Filed: Sep. 28, 2018

(65) Prior Publication Data

US 2019/0121181 A1 Apr. 25, 2019

(30) Foreign Application Priority Data

Sep. 28, 2017 (JP) .................. 2017-188265

(51) Int. Cl.
*G02F 1/1368* (2006.01)
*G02F 1/1335* (2006.01)
(Continued)

(52) U.S. Cl.
CPC ........ *G02F 1/1368* (2013.01); *G02F 1/13394* (2013.01); *G02F 1/133512* (2013.01); *G02F 1/133514* (2013.01); *H01L 27/1225* (2013.01); *H01L 29/24* (2013.01); *H01L 29/7869* (2013.01); *G02F 2201/40* (2013.01); *G02F 2201/52* (2013.01)

(58) Field of Classification Search
CPC ............. G02F 1/1368; G02F 1/133514; G02F 1/133512; G02F 1/13394; G02F 2201/40; G02F 2201/52; H01L 29/7869; H01L 27/1225

USPC .................................................. 349/106–111
See application file for complete search history.

(56) References Cited

U.S. PATENT DOCUMENTS

2009/0033845 A1  2/2009  Tanno et al.
2011/0042668 A1  2/2011  Hama et al.
(Continued)

FOREIGN PATENT DOCUMENTS

JP  2009-036795 A  2/2009
JP  2011-066375 A  3/2011
(Continued)

*Primary Examiner* — Charles S Chang
(74) *Attorney, Agent, or Firm* — ScienBiziP, P.C.

(57) ABSTRACT

A liquid crystal display device includes a first substrate, a second substrate, a liquid crystal layer, and a plurality of columnar spacers. The pixel arrangement is a stripe arrangement including red, green and blue pixel columns. The first substrate includes TFTs, one for each pixel, wherein each TFT includes an oxide semiconductor layer. The second substrate includes a color filter layer and a light-blocking layer. The light-blocking layer includes a plurality of first shading portions extending along the column direction, and a plurality of second shading portions extending along the row direction. Each of the columnar spacers is aligned with one of the second shading portions. At least one of the red, green and blue pixel columns has first pixel boundaries, where one of the second shading portions is present, and second pixel boundaries, where none of the second shading portions present, alternating with each other in the column direction, and the second shading portions are arranged in a staggered arrangement.

12 Claims, 9 Drawing Sheets

(51) Int. Cl.
  *G02F 1/1339* (2006.01)
  *H01L 29/24* (2006.01)
  *H01L 29/786* (2006.01)
  *H01L 27/12* (2006.01)

(56) References Cited

U.S. PATENT DOCUMENTS

| | | |
|---|---|---|
| 2012/0138922 A1 | 6/2012 | Yamazaki et al. |
| 2013/0320334 A1 | 12/2013 | Yamazaki et al. |
| 2014/0286076 A1 | 9/2014 | Aoki et al. |
| 2015/0187301 A1* | 7/2015 | Yoon .................... G09G 3/36 345/88 |
| 2016/0103361 A1* | 4/2016 | Wang .................... G02B 5/201 359/891 |
| 2016/0161789 A1* | 6/2016 | Ahn .................... G02F 1/13394 349/110 |
| 2017/0170200 A1* | 6/2017 | Ikeda .................... G09G 3/2003 |
| 2017/0363894 A1 | 12/2017 | Uchida et al. |
| 2018/0120656 A1 | 5/2018 | Okada et al. |

FOREIGN PATENT DOCUMENTS

| | | |
|---|---|---|
| JP | 2012-134475 A | 7/2012 |
| JP | 2014-007399 A | 1/2014 |
| JP | 2014-209727 A | 11/2014 |
| WO | 2016/104185 A1 | 6/2016 |
| WO | 2017/002724 A1 | 1/2017 |

* cited by examiner

LIQUID CRYSTAL DISPLAY DEVICE

BACKGROUND

1. Technical Field

The present invention relates to a liquid crystal display device, and more particularly to a liquid crystal display device including oxide semiconductor TFTs.

2. Description of the Related Art

An active matrix substrate used in a liquid crystal display device, or the like, includes a switching element such as a thin film transistor (hereinafter, "TFT") for each pixel. As such a switching element, a TFT using an oxide semiconductor layer as the active layer (hereinafter referred to as an "oxide semiconductor TFT") is known in the art. Patent Document 1 (Japanese Laid-Open Patent Publication No. 2012-134475) discloses a liquid crystal display device using InGaZnO (an oxide composed of indium, gallium and zinc) in the active layer of the TFT.

Oxide semiconductor TFTs are capable of operating faster than amorphous silicon TFTs. Since oxide semiconductor films are formed by a simpler process than polycrystalline silicon films, it can be applied to devices that require large areas. Thus, oxide semiconductor TFTs have had high expectations as high-performance active elements that can be manufactured while suppressing the number of manufacturing steps and the manufacturing cost.

Since an oxide semiconductor has a high mobility, it is possible to realize a level of performance that is greater than or equal to that of an amorphous silicon TFT even when the size is reduced relative to a conventional amorphous silicon TFT. Thus, when an active matrix substrate of a liquid crystal display device is manufactured by using an oxide semiconductor TFT, it is possible to reduce the area ratio of the TFT relative to the area of the pixel, thereby improving the pixel aperture ratio. Thus, it is possible to produce bright display even when the amount of light of the backlight is reduced, thereby realizing a low power consumption.

Since oxide semiconductor TFTs have desirable off-leak characteristics, it is possible to use mode of operation with which images are displayed while reducing the image rewrite frequency. For example, when displaying a still image, they can be operated so that the image data is rewritten once per second. Such a driving method is called pause drive or low-frequency drive, and it is possible to significantly reduce the power consumption of the liquid crystal display device.

SUMMARY

As described above, although it is possible to improve the aperture ratio when an oxide semiconductor TFT is used, as compared with a case where an amorphous silicon TFT is used, the definition of the liquid crystal display device has recently been further improved, and there is a demand for further improving the aperture ratio.

However, it is difficult for the following reason to further improve the aperture ratio of a liquid crystal display device having oxide semiconductor TFTs.

The TFT characteristics of oxide semiconductor TFTs deteriorate by being irradiated with light (see Patent Document 2 (Japanese Laid-Open Patent Publication No. 2011-66375)). Specifically, the threshold voltage shifts in the negative direction. Therefore, with liquid crystal display devices including oxide semiconductor TFTs, a black matrix (light-blocking layer) provided on the counter substrate (provided so as to oppose the active matrix substrate) side includes regions that are aligned with the oxide semiconductor TFTs, and the oxide semiconductor TFTs are shaded by these regions (the TFT shading portions). This TFT shading portion hinders the attempt to further improve the aperture ratio.

Patent Document 3 (Japanese Laid-Open Patent Publication No. 2009-36795) discloses a configuration in which a portion of the black matrix is omitted in order to improve the aperture ratio. FIGS. 10A and 10B show a liquid crystal display device 900 having a configuration disclosed in Patent Document 3. FIG. 10A is a plan view showing a pixel arrangement of the liquid crystal display device 900, and FIG. 10B is a plan view showing a configuration of a color filter layer 922 and a black matrix 921 of the liquid crystal display device 900.

As shown in FIG. 10A, with the liquid crystal display device 900, color display pixels CP1 and color display pixels CP2 alternate with each other in the row direction, wherein a color display pixel CP1 includes a pixel of the first color (first pixel) P1, a pixel of the second color (second pixel) P2 and a pixel of the third color (third pixel) P3 arranged in this order from left to right in the figure, and color display pixel CP2 includes the third pixel P3, the second pixel P2 and the first pixel P1 arranged in this order from left to right in the figure.

As shown in FIG. 10B, the color filter layer 922 of the liquid crystal display device 900 includes a color filter of the first color (first color filter) 922a, a color filter of the second color (second color filter) 922b and a color filter of the third color (third color filter) 922c. The black matrix 921 of the liquid crystal display device 900 includes a plurality of longitudinal shading portions 921a extending in the column direction, and a plurality of lateral shading portions 921b extending in the row direction.

With the liquid crystal display device 900, the longitudinal shading portion 921a is omitted between first pixels P1 that are adjacent to each other and between third pixels P3 that are adjacent to each other. Therefore, there is a continuous first color filter 922a for two first pixels P1 that are adjacent to each other, and a continuous third color filter 922c for two third pixel P3 that are adjacent to each other.

With the liquid crystal display device 900 shown in FIGS. 10A and 10B, the longitudinal shading portion 921a is omitted in some regions, thus improving the aperture ratio. However, when the liquid crystal display device 900 is used in applications, such as head-mounted displays, where there is only a very small distance from the eyes of the observer to the liquid crystal panel, it is not possible to suppress the screen-door effect. The screen-door effect is a phenomenon where the black matrix is visible as a door screen pattern to the observer.

The present invention has been made in view of these problems, and an object thereof is to improve the aperture ratio of a liquid crystal display device including oxide semiconductor TFTs and to suppress screen-door effect.

A liquid crystal display device according to an embodiment of the present invention is a display device, including: a first substrate; a second substrate opposing the first substrate; and a liquid crystal layer provided between the first substrate and the second substrate, wherein: the device includes a plurality of pixels arranged in a matrix pattern having rows and columns; the display device further includes a plurality of columnar spacers provided between the first substrate and the second substrate and defining a thickness of the liquid crystal layer; the plurality of pixels include red pixels displaying red, green pixels displaying green, and blue pixels displaying blue; the pixels are arranged in a stripe arrangement that includes a red pixel column, a green pixel column and a blue pixel column; the first substrate includes TFTs, one for each pixel, wherein each TFT includes an oxide semiconductor layer; the second substrate includes a color filter layer and a light-blocking layer; the color filter layer includes a plurality of types of color filters including a red color filter provided in the red pixel column, a green color filter provided in the green pixel column, and a blue color filter provided in the blue pixel column; the light-blocking layer includes a plurality of first shading portions extending in a column direction, and a plurality of second shading portions extending in a row direction; each of the columnar spacers is aligned with one of the second shading portions; where in each of the red pixel column, the green pixel column and the blue pixel column, a pixel boundary refers to a boundary between two pixels that are adjacent to each other along the column direction; at least one of the red pixel column, the green pixel column and the blue pixel column has first pixel boundaries, where one of the second shading portions is present, and second pixel boundaries, where none of the second shading portions is present, alternating with each other in the column direction; and the second shading portions are arranged in a staggered arrangement.

In one embodiment, each of the red pixel column, the green pixel column and the blue pixel column has the first pixel boundaries and the second pixel boundaries alternating with each other in the column direction.

In one embodiment, aperture ratios of the red pixel, the green pixel and the blue pixel are substantially equal to each other.

In one embodiment, two of the red pixel column, the green pixel column and the blue pixel column each have the first pixel boundaries and the second pixel boundaries alternating with each other in the column direction; and the remaining one of the red pixel column, the green pixel column and the blue pixel column has no first pixel boundaries.

In one embodiment, the remaining one pixel column that has no first pixel boundaries is the red pixel column or the green pixel column.

In one embodiment, one of the red pixel column, the green pixel column and the blue pixel column has the first pixel boundaries and the second pixel boundaries alternating with each other in the column direction; and the remaining two of the red pixel column, the green pixel column and the blue pixel column each have no first pixel boundaries.

In one embodiment, the remaining two pixel columns that have no first pixel boundaries are the red pixel column and the green pixel column.

In one embodiment, the oxide semiconductor layer includes an In—Ga—Zn—O-based semiconductor.

In one embodiment, the In—Ga—Zn—O-based semiconductor includes a crystalline portion.

In embodiment, the liquid crystal display device of the present invention is for use in a head-mounted display.

A head-mounted display according to an embodiment of the present invention is a head-mounted display including a display arranged so as to be located in front of an eye of a user wearing the head-mounted display, wherein the display includes the liquid crystal display device having any of the configurations set forth above.

According to an embodiment of the present invention, it is possible to improve the aperture ratio of a liquid crystal display device including oxide semiconductor TFTs, and to suppress the screen-door effect.

DETAILED DESCRIPTION

Embodiments of the present invention will now be described with reference to the drawings. Note that the present invention is not limited to the following embodiments.

Embodiment 1

Figure 1:
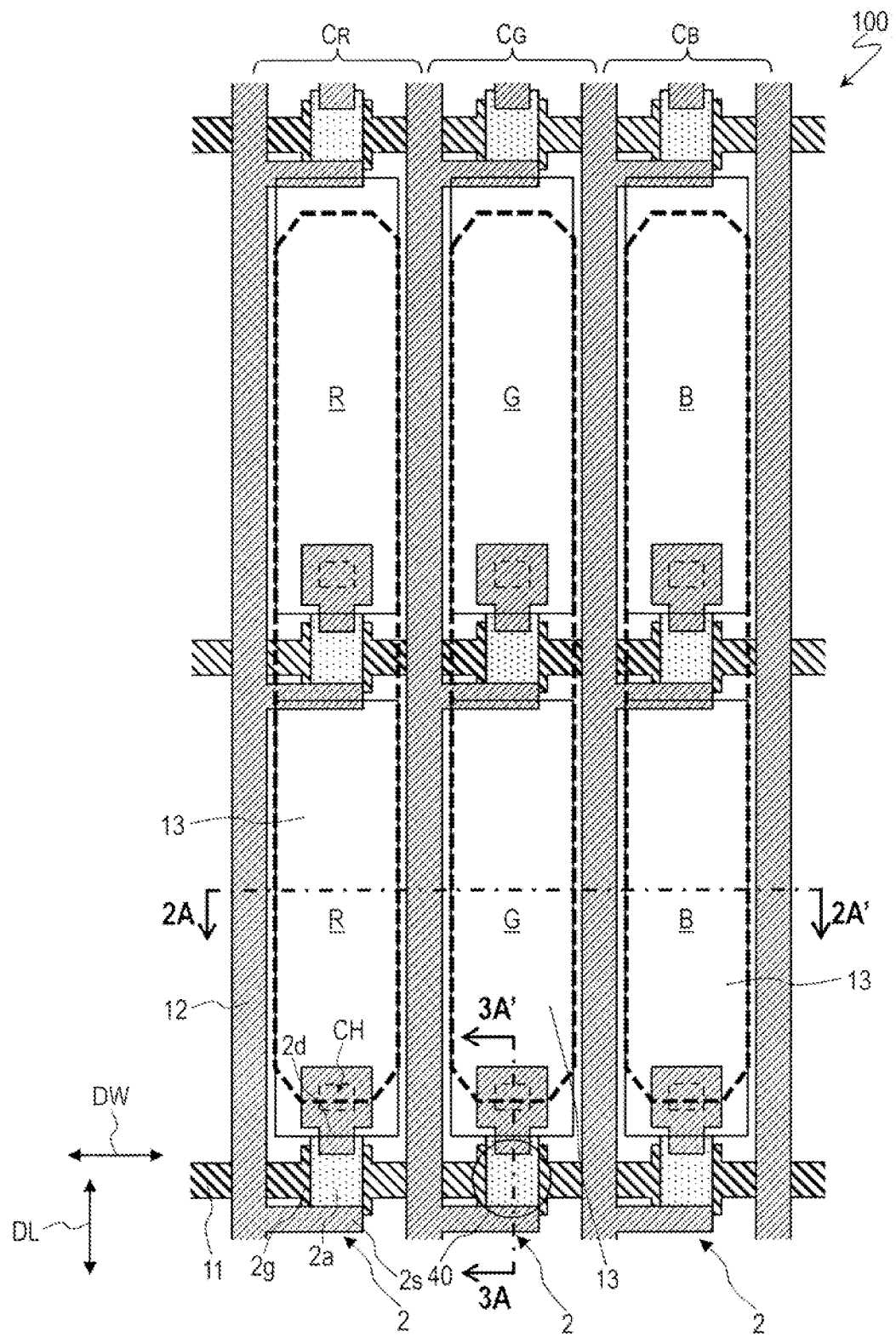
FIG. 1 is a plan view schematically showing a liquid crystal display device 100 according to an embodiment of the present invention.
Figure 2:
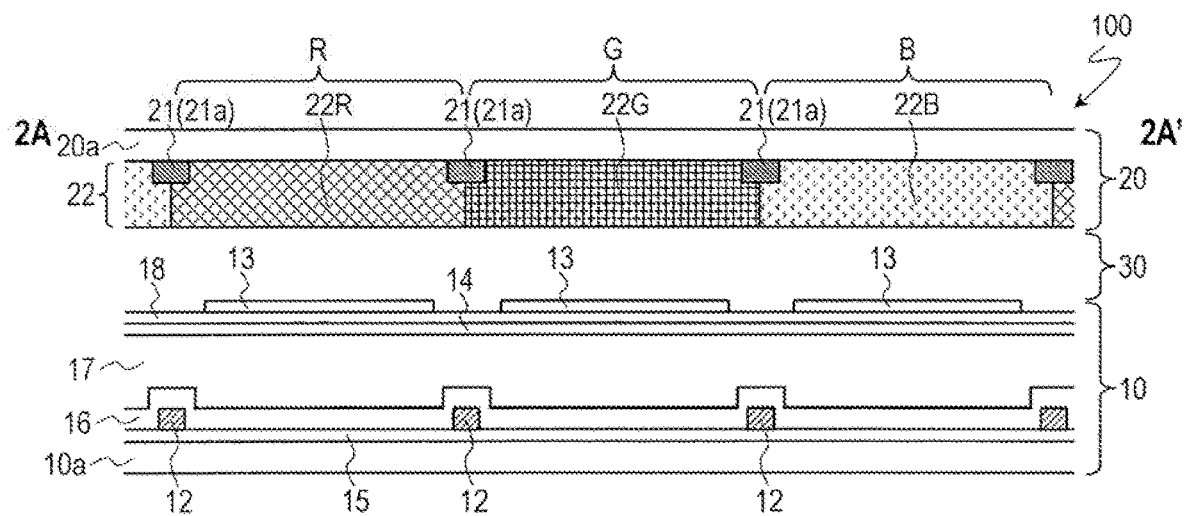
FIG. 2 is a cross-sectional view schematically showing the liquid crystal display device 100, taken along line 2A-2A' of FIG. 1.
Figure 3:
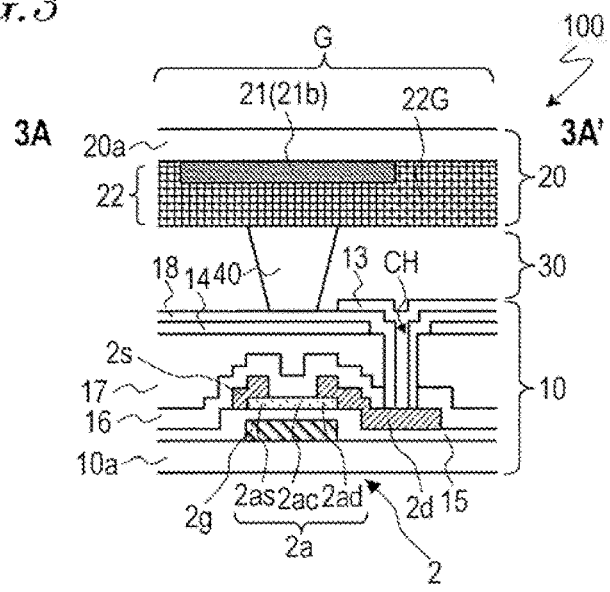
FIG. 3 is a cross-sectional view schematically showing the liquid crystal display device 100, taken along line 3A-3A' of FIG. 1.

Referring to FIG. 1, FIG. 2 and FIG. 3, a liquid crystal display device 100 of the present embodiment will be described. FIG. 1 is a plan view schematically showing the liquid crystal display device 100. FIG. 2 is a cross-sectional view taken along line 2-2A' of FIG. 1. FIG. 3 is a cross-sectional view taken along line 3A-3A' of FIG. 1.

The liquid crystal display device 100 of the present embodiment is a liquid crystal display device for use in a head-mounted display. As shown in FIG. 2, the liquid crystal display device 100 includes a TFT substrate (first substrate) 10, a counter substrate (second substrate) 20 that opposes the TFT substrate 10, and a liquid crystal layer 30 provided between the TFT substrate 10 and the counter substrate 20. The liquid crystal display device 100 further includes a plurality of columnar spacers 40 provided between the TFT substrate 10 and the counter substrate 20 and defining the thickness of the liquid crystal layer 30, as shown in FIG. 1 and FIG. 3.

The liquid crystal display device 100 includes a plurality of pixels arranged in a matrix pattern having rows and columns. In the present embodiment, the pixels of the liquid crystal display device 100 include red pixels R for displaying red, green pixels G for displaying green, and blue pixels B for displaying blue. A color display pixel is composed of three pixels that display different colors from each other (the red pixel R, the green pixel G and the blue pixel B). As shown in FIG. 1, the arrangement of the pixels is a stripe arrangement including a red pixel column $C_R$, a green pixel column $C_G$ and a blue pixel column $C_B$. The red pixel column $C_R$ is composed of an equal number of red pixels R to the number of rows. Similarly, the green pixel column $C_G$ is composed of an equal number of green pixels G to the number of rows, and the blue pixel column $C_B$ is composed of an equal number of blue pixels B to the number of rows.

As shown in FIG. 1, the TFT substrate 10 includes a TFT (thin film transistor) 2 provided in each of the pixels, a plurality of scanning lines (gate bus lines) 11 extending in the row direction, and a plurality of signal lines (source bus lines) 12 extending in the column direction. The TFT substrate 10 includes a pixel electrode 13 provided in each of the pixels, and a common electrode 14 provided so as to oppose the pixel electrodes 13.

As shown in FIG. 3, the TFT 2 includes an oxide semiconductor layer 2a, a gate electrode 2g, a source electrode 2s and a drain electrode 2d. The gate electrode 2g is electrically connected to scanning line 11, and receives a scanning signal voltage supplied from the scanning line 11. In the present embodiment, a portion of the scanning line 11 is made wider than the other portions, and the wider portion functions as the gate electrode 2g. The source electrode 2s is electrically connected to the signal lines 12, and receives a display signal voltage supplied from the signal lines 12. In the present embodiment, the source electrode 2s is extended from the signal line 12. The drain electrode 2d is electrically connected to the pixel electrode 13.

A region 2as of the oxide semiconductor layer 2a that is in contact with the source electrode 2s is referred to as the "source region", and a region 2ad thereof that is in contact with the drain electrode 2d as the "drain region". A region 2ac of the oxide semiconductor layer 2a that overlaps with the gate electrode 2g and is located between the source region 2as and the drain region 2ad is referred to as the "channel region". Thus, the oxide semiconductor layer 2a includes the channel region 2ac, the source region 2as and the drain region 2ad. In the present specification, on a plane that is parallel to the substrate surface, the direction DL parallel to the direction in which a current flows through the channel region 2ac is referred to as the "channel length direction", and the direction DW perpendicular to the channel length direction as the "channel width direction". In the present embodiment, the channel length direction DL is parallel to the column direction (i.e., the channel width direction DW is parallel to the row direction), and the source region 2as, the channel region 2ac and the drain region 2ad are arranged in this order along the column direction. In the present specification, such an arrangement of the TFT 2 is referred to as the "longitudinal arrangement".

Components of the TFT substrate 10 described above are supported by an insulative transparent substrate 10a. The gate electrode 2g and the scanning line 11 are provided on the surface of the transparent substrate 10a on the liquid crystal layer 30 side, and a gate insulating layer 15 is provided so as to cover the gate electrode 2g and the scanning line 11.

The oxide semiconductor layer 2a, the source electrode 2s, the drain electrode 2d and the signal line 12 are provided on the gate insulating layer 15. The source electrode 2s is formed so as to be in contact with the upper surface of the source region 2as of the oxide semiconductor layer 2a, and the drain electrode 2d is formed so as to be in contact with the upper surface of the drain region 2ad of the oxide semiconductor layer 2a.

The inorganic insulating layer 16 is provided so as to cover the oxide semiconductor layer 2a, the source electrode 2s, the drain electrode 2d and the signal line 12. The organic insulating layer 17 is provided on the inorganic insulating layer 16.

The common electrode 14 is provided on the organic insulating layer 17. A dielectric layer 18 is provided so as to cover the common electrode 14. The pixel electrode 13 is provided on the dielectric layer 18. The pixel electrode 13 is connected to the drain electrode 2d through a contact hole CH that runs through the inorganic insulating layer 16, the organic insulating layer 17 and the dielectric layer 18. The pixel electrode 13 and the common electrode 14, and the dielectric layer 18 located therebetween together from a storage capacitor. Note that although not shown in the figure, the pixel electrode 13 has at least one slit, and the liquid crystal display device 100 displays images in an FFS (Fringe Field Switching) mode.

The counter substrate 20 includes light-blocking layer (black matrix) 21 and a color filter layer 22.

The light-blocking layer 21 includes a plurality of first shading portions (longitudinal shading portions) 21a extending along the column direction (herein, the channel length direction DL), and a plurality of second shading portions (lateral shading port ions) 21b extending along the row direction (herein, the channel width direction DW). In FIG. 1, openings of the light-blocking layer 21 (where neither the first shading portion 21a nor the second shading portion 21b is present) are denoted by dotted lines.

The color filter layer 22 includes a plurality of types of color filters that allow light beams of different colors to pass therethrough. In the present embodiment, the color filter layer 22 includes a red color filter 22R, a green color filter 22G and a blue color filter 22B. The red color filter 22R is provided in the red pixel column $C_R$ and allows red light to pass therethrough. The green color filter 22G is provided in green pixel column $C_G$ and allows green light to pass therethrough. The blue color filter 22B is provided in the blue pixel column $C_B$ and allows blue light to pass therethrough.

The components of the counter substrate 20 described above are supported by an insulative transparent substrate 20a.

A pair of alignment films (not shown) are provided on the surface of the TFT substrate 10 on the liquid crystal layer 30 side and on the surface of the counter substrate 20 on the liquid crystal layer 30 side. In the present embodiment, since the display mode is an FFS mode, the pair of alignment films are each a horizontal alignment film.

The liquid crystal display device 100 is a transmissive liquid crystal display device that displays images in a transmissive mode, and further includes a backlight (lighting device) (not shown).

Figure 4:
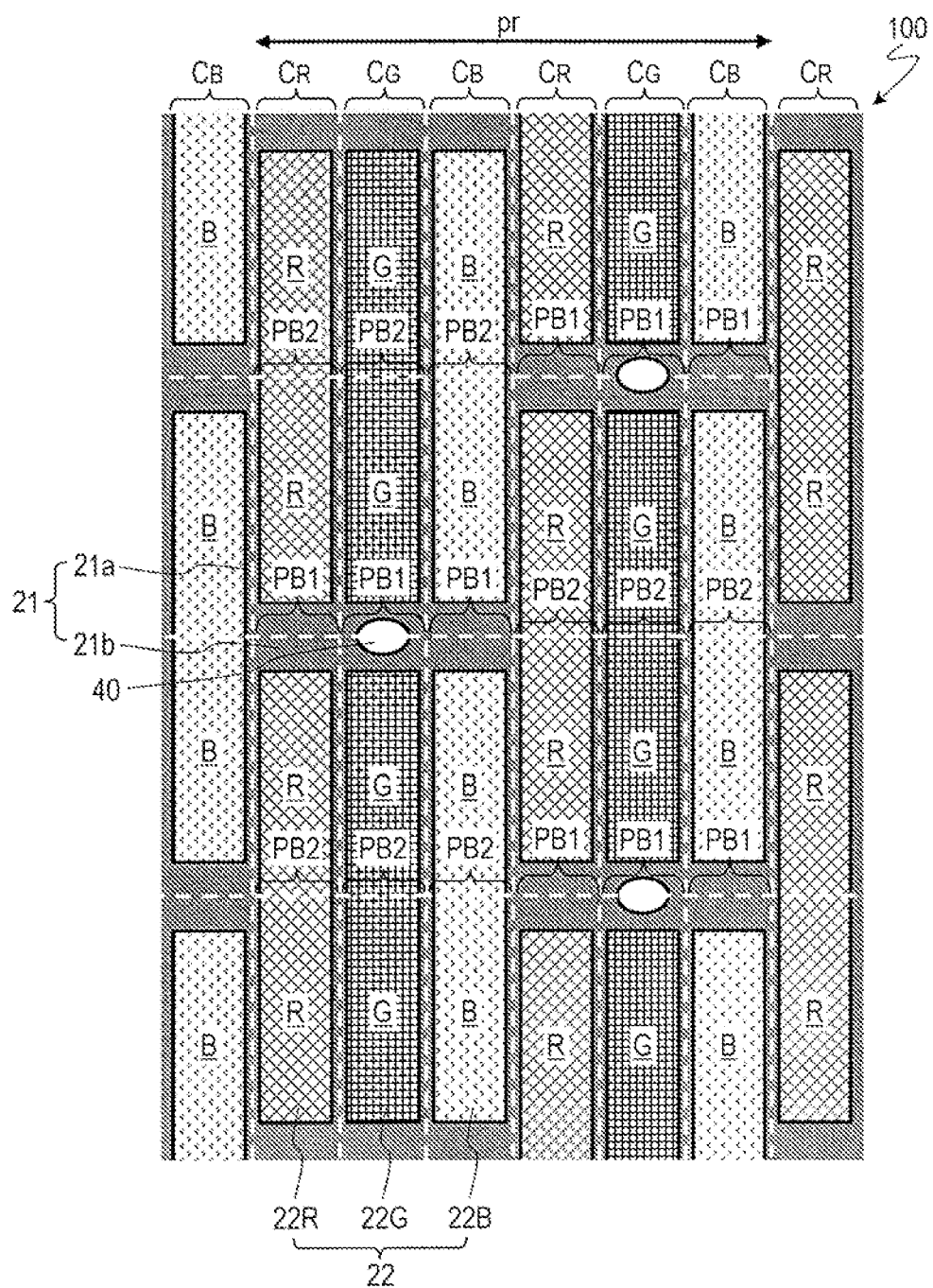
FIG. 4 is a plan view showing a light-blocking layer 21, a color filter layer 22 and a columnar spacer 40 of the liquid crystal display device 100.

Referring also to FIG. 4, the configuration of the light-blocking layer 21 and the color filter layer 22, and the arrangement of the columnar spacers 40 will now be described in detail. FIG. 4 is a plan view showing the light-blocking layer 21, the color filter layer 22 and the columnar spacers 40 of the liquid crystal display device 100, showing an area corresponding to 32 (4 rows by 8 columns) pixels.

Each of the columnar spacers 40 is aligned with one of the second shading portions 21b. Note that in the example shown in FIG. 4, one columnar spacer 40 is arranged for one second shading portion 21b.

In each of the red pixel column $C_R$, the green pixel column $C_G$ and the blue pixel column $C_B$, the boundary between two pixels adjacent to each other in the column direction is referred to as the "pixel boundary". In the present embodiment, as shown in FIG. 4, each of the red pixel column $C_R$, the green pixel column $C_G$ and the blue pixel column $C_B$ has first pixel boundaries PB1, where one of the second shading portions 21b is present, and second pixel boundaries PB2, where none of the second shading portions 21b is present, alternating with each other in the column direction. That is, with an ordinary liquid crystal display device, in each pixel column, a lateral shading portion is provided for each pixel boundary. In contrast, in the present embodiment, the second shading portion 21b is provided for every two pixel boundaries in each pixel column. In other words, in each pixel column, the second shading portions 21b are thinned out so that they are present only with a ½ frequency relative to an ordinary liquid crystal display device.

Since the second shading portions 21b are thinned out as described above, the columnar spacers 40 are arranged so that one columnar spacer 40 corresponds to two color display pixels (i.e., the columnar spacer is provided for every two rows). Note that although one columnar spacer 40 is arranged for one second shading portion 21b in the example shown in FIG. 4, the arrangement density of the columnar spacers 40 is not limited to this. One columnar spacer 40 may be arranged for two or more second shading portions 21b.

As shown in FIG. 4, the second shading portions 21b are provided in a staggered arrangement. Therefore, regarding the red pixel columns $C_R$, the position of a first pixel boundary PB1 of a red pixel column $C_R$ and the position of a first pixel boundary PB1 of another red pixel column $C_R$ are shifted from each other in the column direction (more specifically, shifted by half the cycle, i.e., by one pixel row). Similarly, regarding the green pixel columns $C_G$, the position of a first pixel boundary PB1 of a green pixel column $C_G$ and the position of a first pixel boundary PB1 of another green pixel column $C_G$ are shifted from each other in the column direction (more specifically, shifted by half the cycle, i.e., by one pixel row). Similarly, regarding the blue pixel columns $C_B$, the position of a first pixel boundary PB1 of a blue pixel column $C_B$ and the position of a first pixel boundary PB1 of another blue pixel column $C_B$ are shifted from each other in the column direction (more specifically, shifted by half the cycle, i.e., by one pixel row).

In the example shown in FIG. 4, the position of a first pixel boundary PB1 of a red pixel column $C_R$ and the position of a first pixel boundary PB1 of another, adjacent red pixel column $C_R$ are shifted from each other in the column direction by half the cycle. Similarly, the position of a first pixel boundary PB1 of a green pixel column $C_G$ and the position of a first pixel boundary PB1 of another, adjacent green pixel column $C_G$ are shifted from each other in the column direction by half the cycle. Similarly, the position of a first pixel boundary PB1 of a blue pixel column $C_B$ and the position of a first pixel boundary PB1 of another, adjacent blue pixel column $C_B$ are shifted from each other in the column direction by half the cycle. In the example shown in FIG. 4, the position of the first pixel boundary PB1 in the column direction is the same among three pixel columns that form one color display pixel column (a red pixel column $C_R$, a green pixel column $C_G$ and a blue pixel column $C_B$). Therefore, each second shading portion 21b has a length that corresponds to three pixel columns i.e., a length that corresponds to one color display pixel).

As described above, with the liquid crystal display device 100 of the present embodiment, each of the red pixel column $C_R$, the green pixel column $C_G$ and the blue pixel column $C_B$ has the first pixel boundaries PB1 and the second pixel boundaries PB2 alternating with each other along the column direction. That is, the second shading portions 21b are thinned out relative to an ordinary liquid crystal display device. Thus, it is possible to improve the aperture ratio. Note that as a result of thinning out the second shading portions 21b, some TFTs 2 are not shaded by the second shading portion 21b. Specifically TFTs 2 that are located along the second pixel boundary PB2 are not shaded by the second shading portion 21b. Nevertheless, with a head-mounted display, ambient light does not substantially enter the liquid crystal panel, and there is no need to shade the TFTs. Therefore, the presence of TFTs 2 that are not shaded by the second shading portion 21b does not lead to a problem.

With the liquid crystal display device 100 of the present embodiment, since a plurality of second shading portions 21b are provided in a staggered arrangement, the spatial frequency of the second shading portions 21b is higher than that of an ordinary liquid crystal display device. Therefore, the second shading portions 21b are less likely to be visible to the observer, thus suppressing the screen-door effect.

Figure 10A:
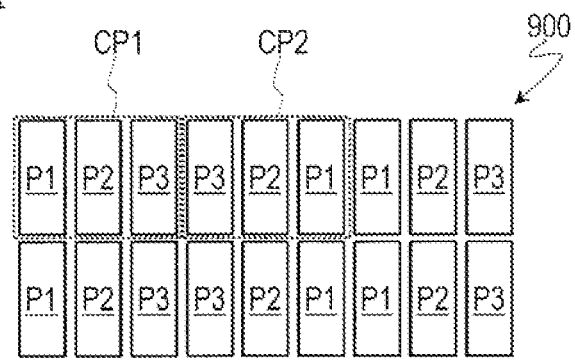
FIG. 10A is a plan view showing a pixel arrangement of the liquid crystal display device 900 having a configuration disclosed in Patent Document 3.
Figure 10B:
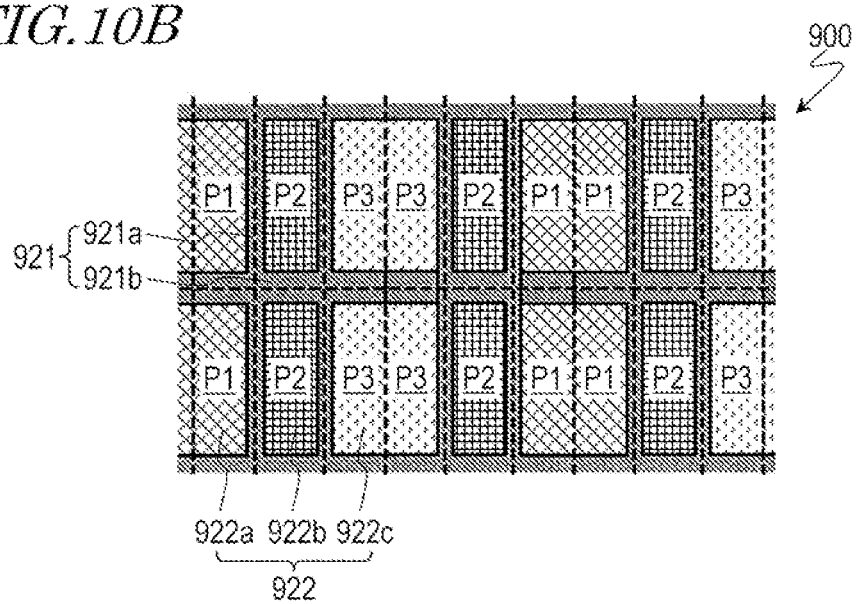
FIG. 10B is a plan view showing a configuration of the color filter layer 922 and the black matrix 921 of the liquid crystal display device 900.

Moreover, with the liquid crystal display device 100 of the present embodiment, each of the red pixel column $C_R$, the green pixel column $C_G$ and the blue pixel column $C_B$ has the first pixel boundaries PB1 and the second pixel boundaries PB2 alternating with each other along the column direction. That is, in each pixel column, the second shading portions 21b are thinned out. Therefore, the aperture ratios of the red pixel R, the green pixel G and the blue pixel B can be made substantially equal to each other. In contrast, with the liquid crystal display device 900 shown in FIGS. 10A and 10B, the aperture ratios of the first pixel P1 and the third pixel P3 are higher than the aperture ratio of the second pixel P2. Thus, when an ordinary backlight for a liquid crystal display device (which is designed on the assumption that a red pixel, a green pixel and a blue pixel have substantially the same aperture ratio) is used, the chromaticity of white deviates from the true chromaticity (hereinafter referred to as "chromaticity deviation"). In contrast, with the liquid crystal display device 100 of the present embodiment, the aperture ratios of the red pixel R, the green pixel G and the blue pixel B can be made substantially equal to each other, and it is possible to suppress the occurrence of chromaticity deviation even when using an ordinary backlight.

The liquid crystal display device 100 of the present embodiment can be manufactured as follows, for example.

First, a method for producing the counter substrate 20 will be described.

First, a light-blocking film is deposited on a transparent substrate (e.g., a glass substrate) 20a, and the light-blocking film is patterned to an intended shape by a photolithography process, thereby forming the light-blocking layer 21 including a plurality of first shading portions 21a and a plurality of second shading portions 21b. The light-blocking layer 21 is a Ti layer having a thickness of 200 nm, for example. Note that the material of the light-blocking layer 21 is not limited to a metal material as listed herein, but may be a black photosensitive resin material, for example.

Next, the red color tilt 22R, the green color filter 22G and the blue color filter 22B are successively formed in regions corresponding to the red pixel R, the green pixel G and the blue pixel B, thus forming the color filter layer 22. The materials of the red color filter 22R, the green color filter 22G and the blue color filter 22B may be colored photosensitive resin materials, for example. Note that an overcoat layer (a flattening layer, not shown in the figure) that covers the color filter layer 22 may be formed.

Then, the columnar spacers 40 are formed so that each columnar spacer 40 is aligned with one of the second shading portions 21b. The columnar spacers 40 are formed from a photosensitive resin material, for example. Finally, an alignment film is formed on the color filter layer 22 (on an overcoat layer when it is formed), thus obtaining the counter substrate 20.

Next, a method for producing the TFT substrate 10 will be described.

First, a conductive film is deposited on a transparent substrate (e.g., a glass substrate) 10a, and the conductive film is patterned to an intended shape by a photolithography process, thereby forming the gate electrode 2g and the scanning line 11. The gate electrode 2g and the scanning line 11 have a layered structure including a TaN layer having a thickness of 30 nm and a W layer having a thickness of 300 nm, which are layered in this order, for example.

Next, the gate insulating layer 15 is formed so as to cover the gate electrode 2g and the scanning line 11. The gate insulating layer 15 has a layered structure including an SiNx layer having a thickness of 325 nm and an $SiO_2$ layer having a thickness of 50 nm, which are layered in this order, for example.

Then, an oxide semiconductor film is deposited on the gate insulating layer 15, and the oxide semiconductor film is patterned by a photolithography process to an intended shape, thus forming the oxide semiconductor layer 2a. The oxide semiconductor layer 2a is an In—Ga—Zn—O-based semiconductor layer having a thickness of 50 nm, for example.

Then, a conductive film is deposited, and the conductive film is patterned to an intended shape by a photolithography process, thereby forming the source electrode 2s, the drain electrode 2d and the signal line 12. The source electrode 2s, the drain electrode 2d and the signal line 12 have a layered structure including a Ti layer having a thickness of 30 nm, an Al layer having a thickness of 200 nm and a Ti layer a thickness of 100 nm, which are layered in this order, for example.

Next, the inorganic insulating layer 16 is formed so as to cover the oxide semiconductor layer 2a, the source electrode 2s, the drain electrode 2d, etc. The inorganic insulating layer 16 is an $SiO_2$ layer having a thickness of 300 nm, for example. Openings are formed in regions of the inorganic insulating layer 16 that are later to be contact holes CH.

Then, the organic insulating layer 17 for the purpose of planarization is formed on the inorganic insulating layer 16. The organic insulating layer 17 is formed from photosensitive resin, for example. Openings are formed in regions of the organic insulating layer 17 that are later to be contact holes CH. Note that the organic insulating layer 17 may be omitted.

Then, a transparent conductive film is deposited on the organic insulating layer 17, and the transparent conductive film is patterned to an intended shape by a photolithography process, thereby forming the common electrode 14. The common electrode 14 is an IZO layer having a thickness of 100 nm, for example.

Next, the dielectric layer 18 is formed so as to cover the common electrode 14. The dielectric layer 18 is an SiN layer having a thickness of 100 nm, for example. Openings are formed in regions of the dielectric layer 18 that are later to be contact holes CH.

Then, a transparent conductive film is deposited on the dielectric layer 18, and the transparent conductive film is patterned to an intended shape by a photolithography process, thereby forming the pixel electrode 13. The pixel electrode 13 is an IZO layer having a thickness of 100 nm, for example. Then, an alignment film is formed across the entire surface so as to cover the pixel electrode 13, thus obtaining the TFT substrate 10.

Alignment films located at the outermost level of the TFT substrate 10 and the counter substrate 20 are subjected to an alignment treatment (e.g., a photoalignment treatment).

The TFT substrate 10 and the counter substrate 20, which are produced as described above, are attached together, and a liquid crystal material is injected into the gap therebetween, thereby forming the liquid crystal layer 30. Then, the obtained structure is severed into individual panels, thus completing the liquid crystal display device 100.

Note that while a configuration where the TFT substrate 10 includes the organic insulating layer 17 is illustrated herein, the organic insulating layer 17 may be omitted, while a configuration where the pixel electrodes 13 are located above the common electrode 14 is illustrated herein, the common electrode 14 may be located above the pixel electrodes 13. While the liquid crystal display device 100 that displays images in an FFS mode (i.e., displays images by using a transverse electric field) is illustrated herein, the display mode is not limited to an FFS mode. As for the display mode, a display mode that uses a vertical electric field such as a VA (Vertical Alignment) mode may be used. With a display mode that uses a vertical electric field, a common electrode (counter electrode) that opposes the pixel electrodes 13 is provided on the counter substrate 20.

Regarding Oxide Semiconductor

The oxide semiconductor included in the oxide semiconductor layer 2a may be an amorphous oxide semiconductor or a crystalline oxide semiconductor having a crystalline portion. Examples of the crystalline oxide semiconductor include a polycrystalline oxide semiconductor, a microcrystalline oxide semiconductor, and a crystalline oxide semiconductor whose c-axis is oriented generally perpendicular to the layer surface.

The oxide semiconductor layer 2a may have a layered structure including two or more layers. When the oxide semiconductor layer 2a has a layered structure, the oxide semiconductor layer 2a may include a non-crystalline oxide semiconductor layer and a crystalline oxide semiconductor layer. Alternatively, it may include a plurality of crystalline oxide semiconductor layers having different crystalline structures. It may include a plurality of non-crystalline oxide semiconductor layers when the oxide semiconductor layer 2a has a two-layer structure including an upper layer and a lower layer, it is preferred that the energy gap of the oxide semiconductor included in the upper layer is greater than the energy gap of the oxide semiconductor included in the lower layer. Note however that when the energy gap difference between these layers is relatively small, the energy gap of the oxide semiconductor of the lower layer may be greater than the energy gap of the oxide semiconductor of the upper layer.

The material, the structure, the film formation method of the non-crystalline oxide semiconductor and each of the crystalline oxide semiconductors, and the configuration of an oxide semiconductor layer having a layered structure, etc., are described in Japanese Laid-Open Patent Publication No. 2014-007399, for example. The disclosure of Japanese Laid-Open Patent Publication No. 2014-007399 is herein incorporated by reference in its entirety.

The oxide semiconductor layer 2a may at least include one metal element from among In, Ga and Zn, for example. In the present embodiment, the oxide semiconductor layer 2a includes an In—Ga—Zn—O-based semiconductor (e.g., indium gallium zinc oxide), for example. Now, the In—Ga—Zn—O-based semiconductor is a ternary oxide of In (indium), Ga (gallium) and Zn (zinc), and there is no particular limitation on the ratio (composition ratio) between In, Ga and Zn, examples of which include In:Ga:Zn=2:2:1, In:Ga:Zn=1:1:1 and In:Ga:Zn=1:1:2, for example. Such an oxide semiconductor layer 2a can be formed from an oxide semiconductor film including an In—Ga—Zn—O-based semiconductor. Note that a channel-etched type TFT having an active layer including an oxide semiconductor such as an In—Ga—Zn—O-based semiconductor is in some cases referred to as a "CE-OS-TFT".

The In—Ga—Zn—O-based semiconductor may be amorphous or crystalline. The crystalline In—Ga—Zn—O-based semiconductor is preferably a crystalline In—Ga—Zn—O-based semiconductor whose c-axis is oriented generally perpendicular to the layer surface.

Note that crystalline structures of crystalline In-G-Zn—O-based semiconductors are disclosed in, for example, Japanese Laid-Open Patent Publication No. 2014-007399, supra, Japanese Laid-Open Patent Publication No. 2012-134375, Japanese Laid-Open Patent Publication No. 2014-209727, etc. The disclosures of Japanese Laid-open Patent Publication No. 2012-134475 and Japanese Laid-Open Patent Publication No. 2014-209727 are herein incorporated by reference in their entirety. Since TFTs including an In—Ga—Zn—O-based semiconductor layer have a high mobility (more than 20 times that of an a-SiTFT) and a low leak current (less than 1/100 that of an a-SiTFT), they can desirably be used as driver TFTs (e.g., TFTs included in driver circuits provided around the display region including a plurality of pixels and on the same substrate as the display region) and pixel TFTs (TFTs provided in pixels).

The oxide semiconductor layer 2a may include another oxide semiconductor instead of an In—Ga—Zn—O-based semiconductor. For example, it may include an In—Sn—Zn—O-based semiconductor (e.g., $In_2O_3$—$SnO_2$—ZnO; InSnZnO). The In—Sn—Zn—O-based semiconductor is a ternary oxide of In (indium), Sn (tin) and Zn (zinc). Alternatively, the oxide semiconductor layer 2a may include an In—Al—Zn—O-based semiconductor, an In—Al—Sn—Zn—O-based semiconductor, a Zn—O-based semiconductor, an In—Zn—O-based semiconductor, a Zn—Ti—O-based semiconductor, a Cd—Ge—O-based semiconductor, a Cd—Pb—O-based semiconductor, CdO (cadmium oxide), an Mg—Zn—O-based semiconductor, an In—Ga—Sn—O-based semiconductor, an In—Ga—O-based semiconductor, a Zr—In—Zn—O-based semiconductor, an Hf—In—Zn—O-based semiconductor, or the like.

Note that the TFT 2, which is an oxide semiconductor TFT, may be a "channel-etched-type TFT" or an "etch stop-type TFT".

With a "channel-etched-type TFT", as shown in FIG. 3, for example, no etch stop layer is formed over the channel region, and the lower surface of the channel-side end portion of the source and drain electrode is arranged to be in contact with the upper surface of the oxide semiconductor layer. A channel-etched-type TFT is formed by, for example, forming a conductive film to be source-drain electrodes on an oxide semiconductor layer, and then performing a source-drain separation. In the source-drain separation step, a surface portion of the channel region may be etched.

On the other hand, with a TFT including an etch stop layer formed over the channel region (an etch stop-type TFT), the lower surface of the channel-side end portion of the source and drain electrode is located on the etch stop layer, for example. An etch stop-type TFT is formed by, for example, forming an etch stop layer that covers a portion of an oxide semiconductor layer to be the channel region, then forming a conductive film to be source-drain electrodes on the oxide semiconductor layer and the etch stop layer, and then performing a source-drain separation.

Embodiment 2

Figure 5:
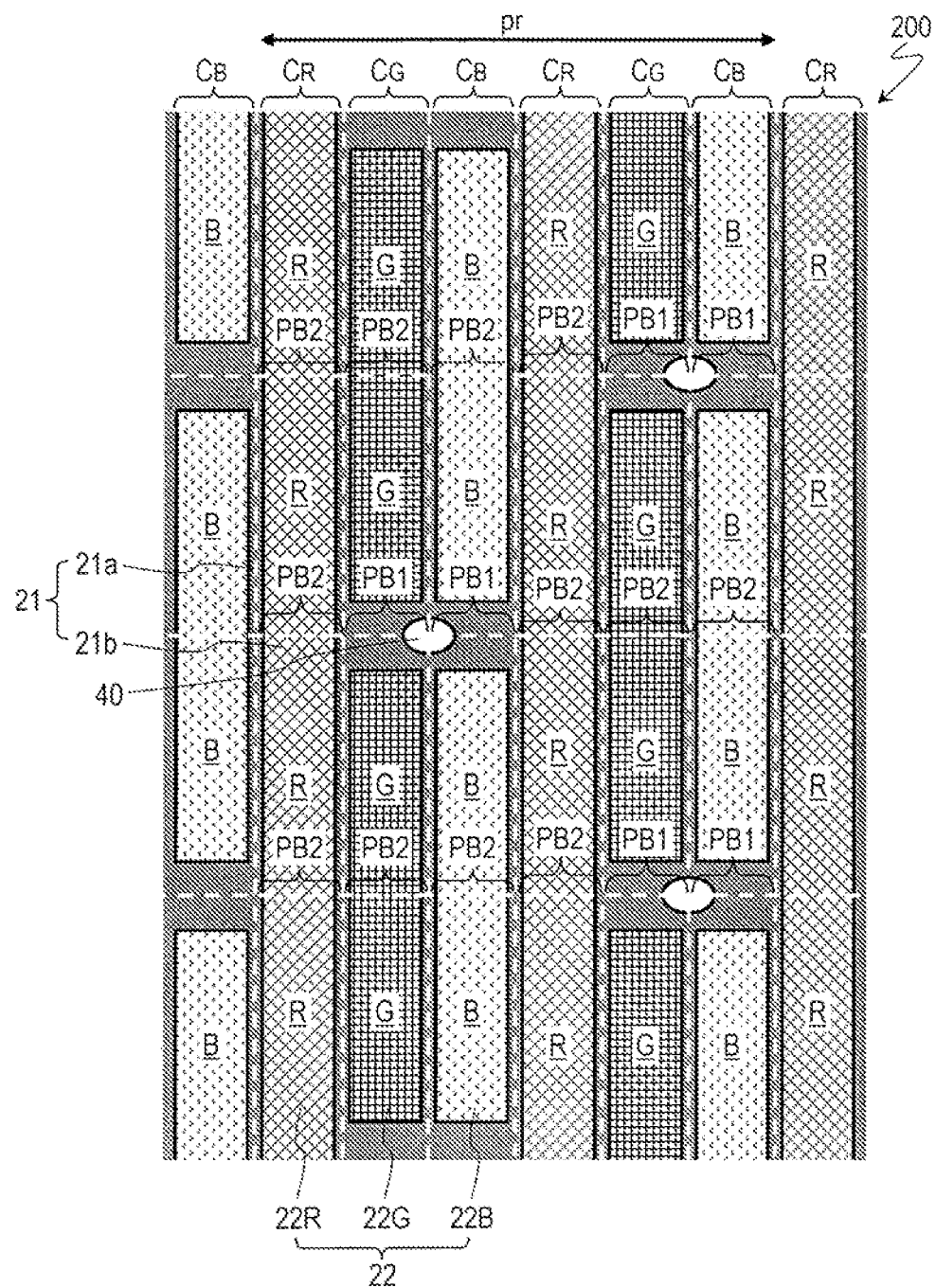
FIG. 5 is a plan view schematically showing a liquid crystal display device 200 according to an embodiment of the present invention.

Referring to FIG. 5, a liquid crystal display device 200 of the present embodiment will be described. FIG. 5 is a plan view showing the light-blocking layer 21, the color filter layer 22 and the columnar spacer 40 of the liquid crystal display device 200, showing an area corresponding to 32 (4 rows by 8 columns) pixels. The following description will focus on differences between the liquid crystal display device 200 and the liquid crystal display device 100 of Embodiment 1.

In the present embodiment, each of the green pixel column $C_G$ and the blue pixel column $C_B$ has the first pixel boundaries PB1, where one of the second shading portions 21b is present, and the second pixel boundaries PB2, where none of the second shading portions 21b is present, alternating with each other along the column direction. In contrast, the red pixel column $C_R$ has no first pixel boundaries PB1 and only has the second pixel boundaries PB2 along the column direction. Therefore, each second shading portion 21b has a length that corresponds to two pixel columns.

Thus, with the liquid crystal display device 200 of the present embodiment, no second shading portion 21b is provided in the red pixel column $C_R$. Therefore, it is possible to further improve the aperture ratio.

Note however that in the present embodiment, the aperture ratio of the red pixel R is higher than the aperture ratios of the green pixel G and the blue pixel B. That is, the aperture ratios of the red pixel R, the green pixel G and the blue pixel B are not substantially equal to each other. Thus, in order to suppress the occurrence of chromaticity deviation as described above, the transmission spectrums of the red color filter 22R, the green color filter 22G and the blue color filter 22B may be adjusted.

Figure 6:
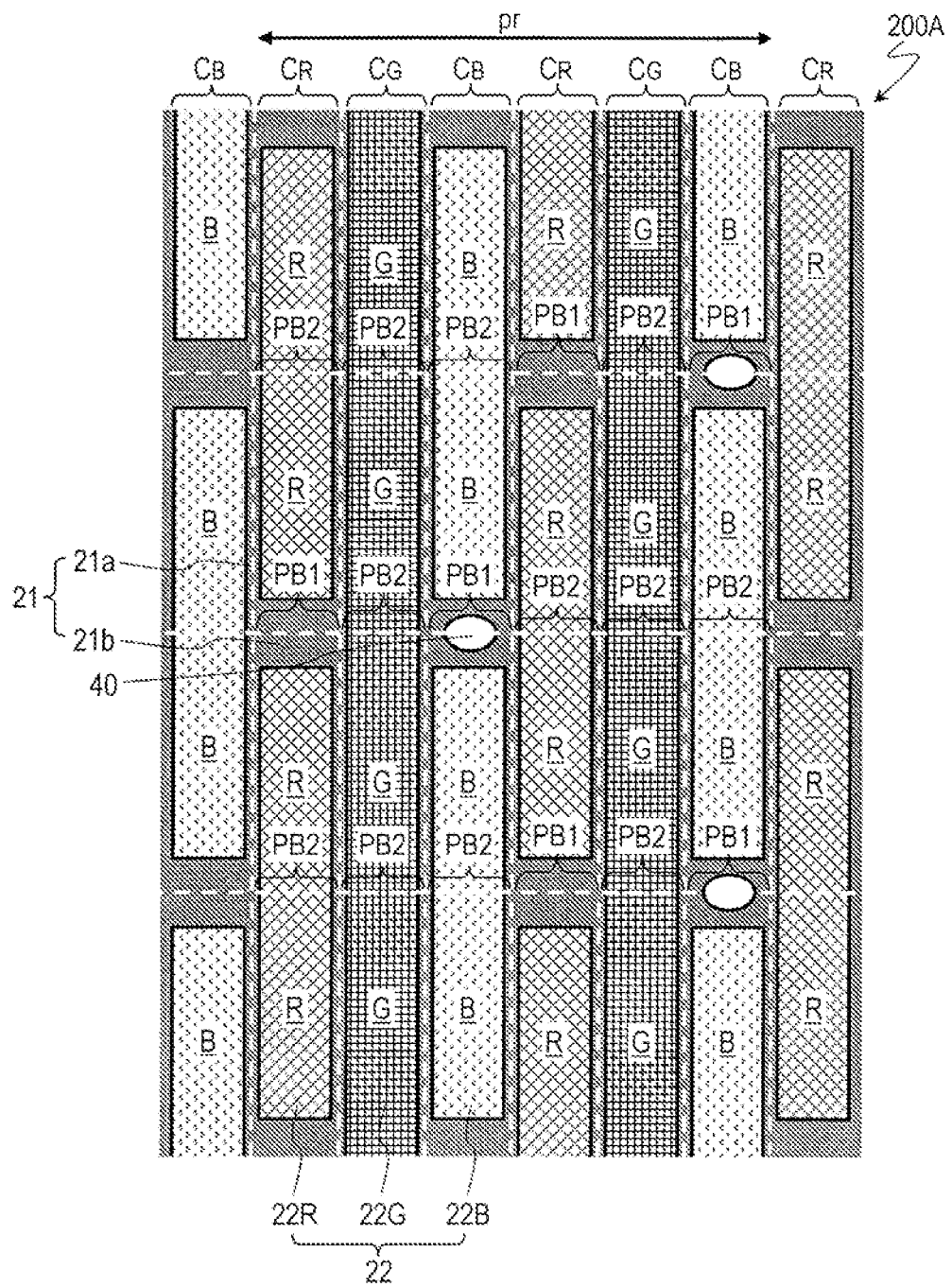
FIG. 6 is a plan view schematically showing a liquid crystal display device 200A according to an embodiment of the present invention.

Note that while FIG. 5 shows an example where the pixel column that does not have first pixel boundaries PB1 (i.e., where no second Shading portions 21b are formed) is the red pixel column $C_R$, it may be a different pixel column that does not have first pixel boundaries PB1. FIG. 6 shows another liquid crystal display device 200A of the present embodiment.

With the liquid crystal display device 200A shown in FIG. 6, each of the red pixel column $C_R$ and the blue pixel column $C_B$ has the first pixel boundaries PB1 and the second pixel boundaries PB2 alternating with each other along the column direction. In contrast, the green pixel column $C_G$ has no first pixel boundaries PB1 and only has the second pixel boundaries PB2 along the column direction.

Thus, with the liquid crystal display device 200A shown in FIG. 6, no second shading portions 21b are formed in the green pixel column $C_G$. Therefore, as with the liquid crystal display device 200 shown in FIG. 5, it is possible to further improve the aperture ratio.

Note that although not shown in the figure, one may employ a configuration in which each of the red pixel column $C_R$ and the green pixel column $C_G$ has the first pixel boundaries PB1 and the second pixel boundaries PB2 alternating with each other along the column direction, and the blue pixel column $C_B$ has no first pixel boundaries PB1. Note however that even if the aperture ratio is low, the blue pixel B is less perceived by human eyes than the other pixels (the red pixel R and the green pixel G). In view of this, the pixel column that has no first pixel boundaries PB1 is preferably the red pixel column $C_R$ or the green pixel column $C_G$.

Embodiment 3

Figure 7:
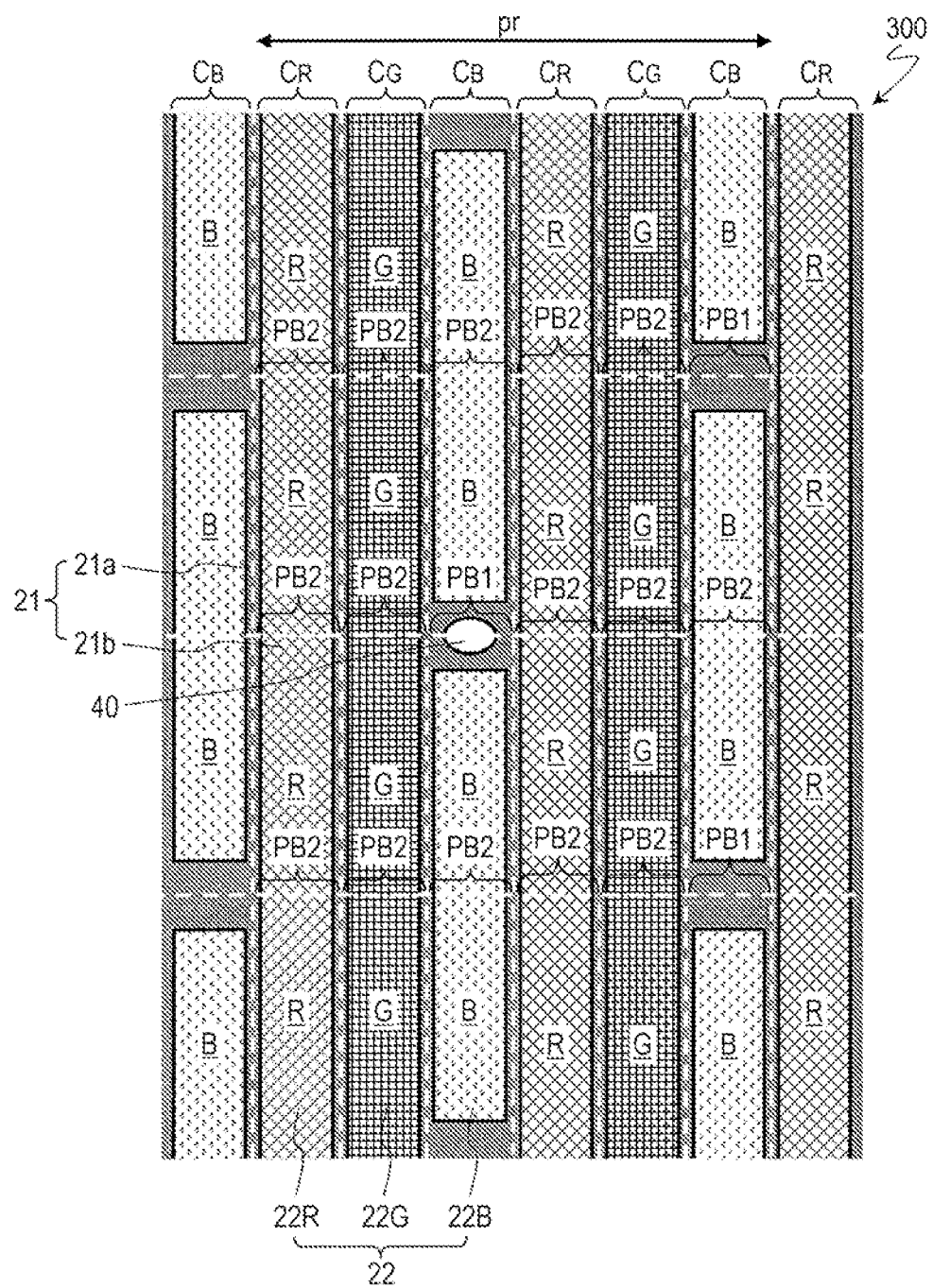
FIG. 7 is a plan view schematically showing a liquid crystal display device 300 according to an embodiment of the present invention.

Referring to FIG. 7, a liquid crystal display device 300 of the present embodiment will be described. FIG. 7 is a plan view showing the light-blocking layer 21, the color filter layer 22 and the columnar spacer 40 of the liquid crystal display device 300, showing an area corresponding to 32 (4 rows by 8 columns) pixels. The following description will focus on differences between the liquid crystal display device 300, and the liquid crystal display device 100 of Embodiment 1 and the liquid crystal display devices 200 and 200A of Embodiment 2.

In the present embodiment, the blue pixel column $C_B$ has the first pixel boundaries PB1, where one of the second shading portions 21b is present, and the second pixel boundaries PB2, where none of the second shading portions 21b is present, alternating with each other along the column direction. In contrast, each of the red pixel column $C_R$ and the green pixel column $C_G$ has no first pixel boundaries PB1 and only has the second pixel boundary PB2 along the column direction. Therefore, each second shading portion 21b has a length that corresponds to one pixel column.

Thus, with the liquid crystal display device 300 of the present embodiment, no second shading portion 21b is provided in the red pixel column $C_R$ and in the green pixel column $C_G$. Therefore, it is possible to further improve the aperture ratio.

Note however that in the present embodiment, the aperture ratios of the red pixel R and the green pixel G are higher than the aperture ratio of the blue pixel B. That is, the aperture ratios of the red pixel R, the green pixel G and the blue pixel B are not substantially equal to each other. Thus, in order to suppress the occurrence of chromaticity deviation as described above, the transmission spectrums of the red color filter 22R, the green color filter 22G and the blue color filter 22B may be adjusted.

Note that while FIG. 7 shows an example where the pixel column that does not have first pixel boundaries PB1 (i.e., where no the second shading portions 21b are formed) is the red pixel column $C_R$ and the green pixel column $C_G$, the combination of pixel columns that do not have the first pixel boundaries PB1 is not limited to the example illustrated herein. That is, the pixel column that does not have first pixel boundaries PB1 may be the red pixel column $C_R$ and the blue pixel column $C_B$, or may be the green pixel column $C_G$ and the blue pixel column $C_B$. Note however that in view of the inability to be perceived human eyes when the aperture ratio is low, it is preferred that the pixel column that does not have first pixel boundaries PB1 is the red pixel column $C_R$ and the green pixel column $C_G$. In other words, it is preferred that the pixel column where the second shading portions 21b are formed (the pixel column where the columnar spacers 40 are arranged) is the blue pixel column $C_B$.

Other Embodiments

Figure 8:
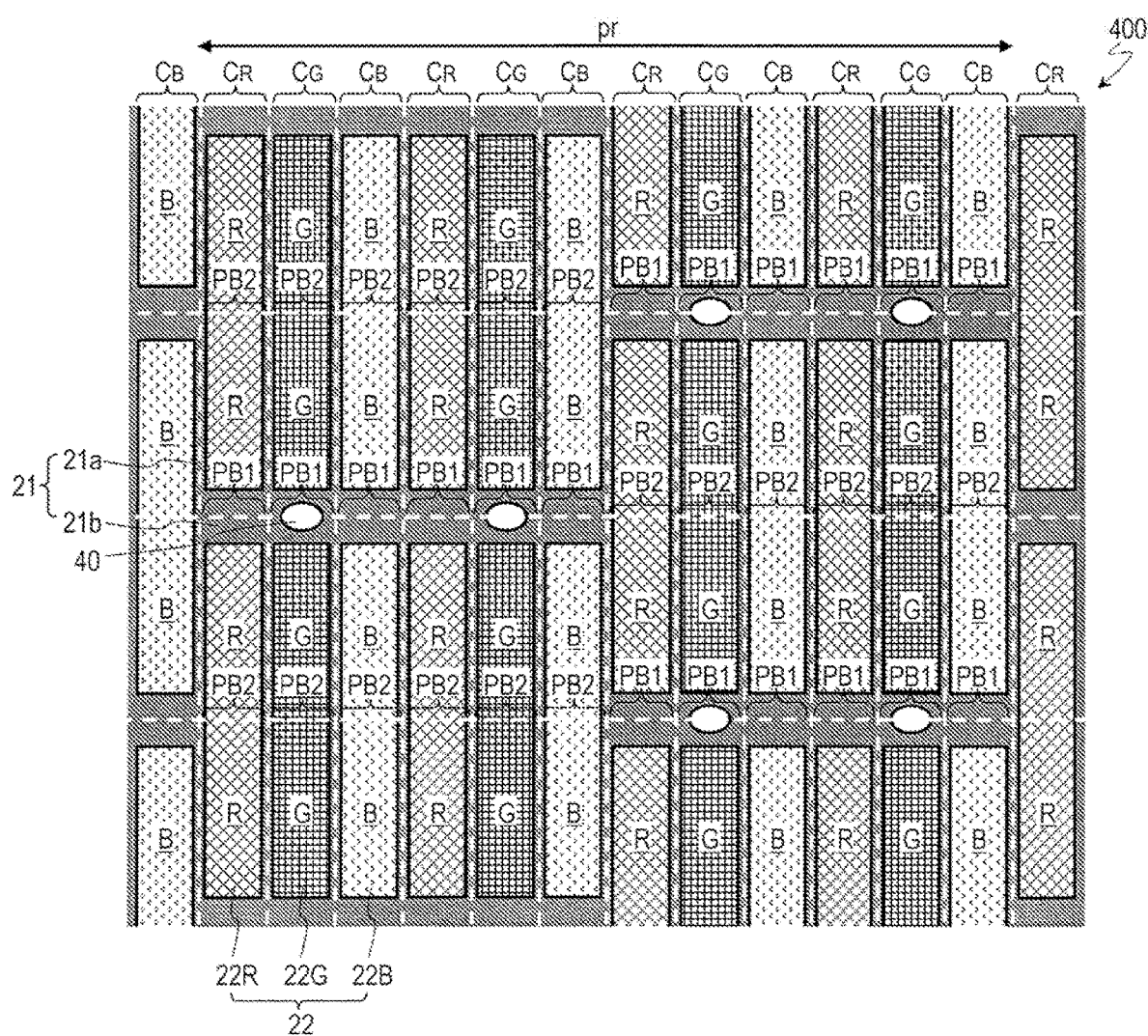
FIG. 8 is a plan view schematically showing a liquid crystal display device 400 according to an embodiment of the present invention.

The cycle of staggered arrangement of the second shading portions 21b is not limited to the examples shown in Embodiments 1 to 3. FIG. 8 shows another liquid crystal display device 400 according to an embodiment of the present invention.

In the examples shown in Embodiments 1 to 3, the cycle of staggered arrangement is twice the length of one color display pixel along the row direction (indicated by arrow pr in FIG. 4, etc.). In contrast, with the liquid crystal display device 400 of the present embodiment, one cycle pr of staggered arrangement is four times the length of one color display pixel along the row direction.

In the example shown in FIG. 8, the position of the first pixel boundary PB1 of a pair of red pixel columns $C_R$ (herein, a "pair" refers to two red pixel columns $C_R$ that are adjacent to each other) and the position of the first pixel boundary PB1 of another, adjacent pair of red pixel columns $C_R$ are shifted from each other in the column direction by half the cycle. Similarly, the position of the first pixel boundary PB1 of a pair of green pixel columns $C_G$ (two green pixel columns $C_G$ that are adjacent to each other) and the position of the first pixel boundary PB1 of another, adjacent pair of green pixel columns $C_G$ are shifted from each other in the column direction by half the cycle. Similarly, the position of the first pixel boundary PB1 of a pair of blue pixel columns $C_B$ (two blue pixel columns $C_B$ that are adjacent to each other) and the position of the first pixel boundary PB1 of another, adjacent pair of blue pixel columns $C_B$ are shifted from each other in the column direction by half the cycle. In the example shown in FIG. 8, the position of the first pixel boundary PB1 in the column direction is the same among three pixel columns that form one color display pixel column (a red pixel column $C_R$, a green pixel column $C_G$ and a blue pixel column $C_B$). Therefore, each second shading portion 21b has a length that corresponds to six pixel columns (i.e., a length that corresponds to two color display pixels).

Even with a staggered arrangement as shown in FIG. 8, the spatial frequency of the second shading portions 21b is higher than that of an ordinary liquid crystal display device, thus realizing the effect of suppressing the screen-door effect. Note however that when one cycle pr of staggered arrangement is too long, it may not be possible to realize a sufficient effect of suppressing the screen-door effect. In view of this, one cycle pr of staggered arrangement is preferably less than or equal to four times the length of one color display pixel along the row direction, and more preferably twice the length (i.e., the configurations illustrated in Embodiments 1 to 3).

Head-Mounted Display

Figure 9A:
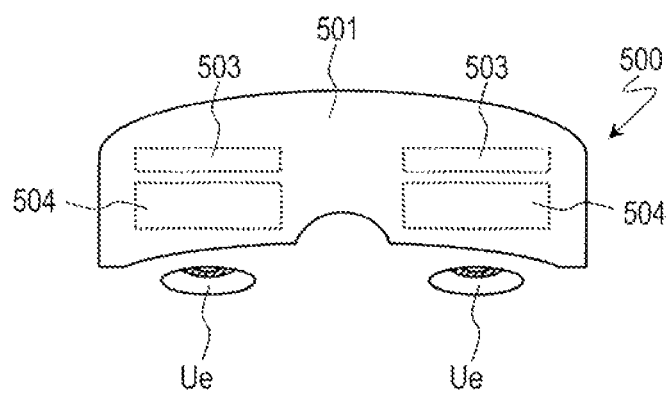
FIG. 9A is a view showing a schematic configuration of a head-mounted display 500.
Figure 9B:
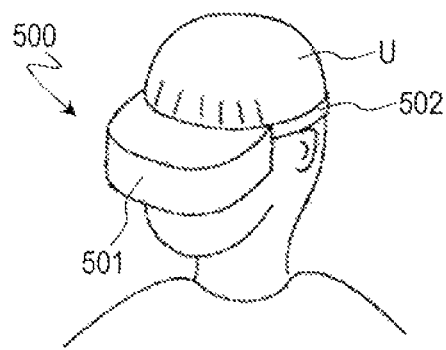
FIG. 9B is a view showing a state where the head-mounted display 500 is worn by a user U.

The liquid crystal display devices 100, 200, 200A, 300 and 400 according to an embodiment of the present invention can suitably be used in head-mounted displays (HMDs). An example of an HMD is shown in FIGS. 9A and 9B. FIG.

9A shows a schematic configuration of an HMD 500, and FIG. 9B shows the HMD 500 worn by a user U.

As shown in FIGS. 9A and 9B, the HMD 500 includes a housing 501, a strap 502, displays 503 and optical systems 504. The housing 501 accommodates therein the displays 503 and the optical systems 504. The strap 502 is attached to the left edge and the right edge of the housing 501. The HMD 500 including the housing 501 is secured (mounted) on the head of the user U by means of the strap 502.

The displays 503 are arranged so as to be located in front of the eyes Ue of the user U wearing the HMD 500. The displays 503 each include a liquid crystal display device for displaying images. The optical systems 504 are located between the displays 503 and the eyes Ue of the user U. The user U observes images displayed on the liquid crystal display devices of the displays 503 through the optical systems 504.

The liquid crystal display devices 100, 200, 200A, 300 or 400 according to an embodiment of the present invention can suitably be used as the liquid crystal display devices included in the displays 503. Note that the configuration of an HMD with which liquid crystal display devices according to an embodiment of the present invention are used is not limited to the configuration illustrated in FIGS. 9A and 9B.

This application is based Japanese Patent Application No. 2017-188265 filed on Sep. 28, 2017, the entire contents of which are hereby incorporated by reference.

What is claimed is:

1. A liquid crystal display device, comprising:
a first substrate;
a second substrate opposing the first substrate; and
a liquid crystal layer provided between the first substrate and the second substrate, wherein:
the liquid crystal display device includes a plurality of pixels arranged in a matrix pattern having rows and columns;
the liquid crystal display device further includes a plurality of columnar spacers provided between the first substrate and the second substrate and defining a thickness of the liquid crystal layer;
the plurality of pixels includes red pixels displaying red, green pixels displaying green, and blue pixels displaying blue;
the pixels are arranged in a stripe arrangement that includes a red pixel column, a green pixel column and a blue pixel column;
the first substrate includes TFTs, one for each pixel, wherein each TFT includes an oxide semiconductor layer;
the second substrate includes a color filter layer and a light-blocking layer;
the color filter layer includes a plurality of types of color filters including a red color filter provided in the red pixel column, a green color filter provided in the green pixel column, and a blue color filter provided in the blue pixel column;
the light-blocking layer includes a plurality of first shading portions extending in a column direction, and a plurality of second shading portions extending in a row direction;
each of the columnar spacers is aligned with one of the second shading portions;
where in each of the red pixel column, the green pixel column and the blue pixel column, a pixel boundary refers to a boundary between two pixels that are adjacent to each other along the column direction;
at least one of the red pixel column, the green pixel column and the blue pixel column has first pixel boundaries, where one of the plurality of the second shading portions is present, and second pixel boundaries, where none of the second shading portions is present, alternating with each other in the column direction;
in each of the first pixel boundaries, the one of the plurality of second shading portions is located between two pixels that display the same color; and
the second shading portions are arranged in a staggered arrangement.

2. The liquid crystal display device of claim 1, wherein each of the red pixel column, the green pixel column and the blue pixel column has the first pixel boundaries and the second pixel boundaries alternating with each other in the column direction.

3. The liquid crystal display device of claim 2, wherein aperture ratios of the red pixel, the green pixel and the blue pixel are substantially equal to each other.

4. The liquid crystal display device of claim 1, wherein:
two of the red pixel column, the green pixel column and the blue pixel column each have the first pixel boundaries and the second pixel boundaries alternating with each other in the column direction; and
the remaining one of the red pixel column, the green pixel column and the blue pixel column has no first pixel boundaries.

5. The liquid crystal display device of claim 4, wherein the remaining one pixel column that has no first pixel boundaries is the red pixel column or the green pixel column.

6. The liquid crystal display device of claim 1, wherein:
one of the red pixel column, the green pixel column and the blue pixel column has the first pixel boundaries and the second pixel boundaries alternating with each other in the column direction; and
the remaining two of the red pixel column, the green pixel column and the blue pixel column each have no first pixel boundaries.

7. The liquid crystal display device of claim 6, wherein the remaining two pixel columns that have no first pixel boundaries are the red pixel column and the green pixel column.

8. The liquid crystal display device of claim 1, wherein the oxide semiconductor layer includes an In—Ga—Zn—O-based semiconductor.

9. The liquid crystal display device of claim 8, wherein the In—Ga—Zn—O-based semiconductor includes a crystalline portion.

10. The liquid crystal display device of claim 1, wherein the liquid crystal display device is for use in a head-mounted display.

11. A head-mounted display comprising a display arranged so as to be located in front of an eye of a user wearing the head-mounted display,
wherein the display includes the liquid crystal display device of claim 1.

12. The liquid crystal display device of claim 1, wherein the plurality of pixels does not include any white pixel displaying white.

* * * * *